(12) United States Patent
Morgan et al.

(10) Patent No.: US 7,072,237 B2
(45) Date of Patent: Jul. 4, 2006

(54) METHOD AND SYSTEM FOR LOW POWER REFRESH OF DYNAMIC RANDOM ACCESS MEMORIES

(75) Inventors: Donald M. Morgan, Meridian, ID (US); Greg A. Blodgett, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 98 days.

(21) Appl. No.: 10/753,895

(22) Filed: Jan. 8, 2004

(65) Prior Publication Data

US 2004/0145960 A1    Jul. 29, 2004

Related U.S. Application Data

(62) Division of application No. 10/122,943, filed on Apr. 11, 2002, now Pat. No. 6,751,143.

(51) Int. Cl.
*G11C 7/00* (2006.01)

(52) U.S. Cl. .............. 365/222; 365/227; 365/228; 365/230.06; 365/230.04; 365/190

(58) Field of Classification Search ........ 365/227, 365/228, 229, 226, 230.06, 230.04, 222, 365/190
See application file for complete search history.

(56) References Cited

U.S. PATENT DOCUMENTS

| | | | |
|---|---|---|---|
| 4,661,929 A | 4/1987 | Aoki et al. | 365/149 |
| 4,961,167 A | 10/1990 | Kumanoya et al. | 365/189.09 |
| 5,134,699 A | 7/1992 | Aria et al. | 710/35 |
| 5,148,546 A | 9/1992 | Blodgett | 713/320 |
| 5,229,647 A | 7/1993 | Gnadinger | 257/785 |
| 5,321,662 A | 6/1994 | Ogawa | 365/222 |
| 5,381,368 A | 1/1995 | Morgan et al. | 365/189.01 |
| 5,414,861 A | 5/1995 | Horning | 365/229 |
| 5,475,645 A | 12/1995 | Wada | 365/222 |
| 5,630,091 A | 5/1997 | Lin et al. | 711/110 |
| 5,712,795 A | 1/1998 | Layman et al. | 700/297 |
| 5,729,497 A | 3/1998 | Pawlowski | 365/200 |
| 5,764,562 A | 6/1998 | Hamamoto | 365/149 |

(Continued)

FOREIGN PATENT DOCUMENTS

WO        96/28825        9/1996

OTHER PUBLICATIONS

Stallings, William, "*Computer Organization & Architecture: Designing for Performance,*" pp. 103-116.

(Continued)

*Primary Examiner*—Andrew Q. Tran
(74) *Attorney, Agent, or Firm*—Dorsey & Whitney LLP.

(57) ABSTRACT

A method and system for operating a DRAM device in either a high power, full density mode or a low power, half density mode. In the full density mode, each data bit is stored in a single memory cell, and, in the half density mode, each data bit is stored in two memory cells that are refreshed at the same time to permit a relatively slow refresh rate. When transitioning from the full density mode to the half density mode, data are copied from each row of memory cells storing data to an adjacent row of memory cells. The adjacent row of memory cells are made free to store data from an adjacent row by remapping the most significant bit of the row address to the least significant bit of the row address, and then remapping all of the remaining bits of the row address to the next highest order bit.

13 Claims, 10 Drawing Sheets

U.S. PATENT DOCUMENTS

| | | | |
|---|---|---|---|
| 5,781,483 A | 7/1998 | Shore | 365/200 |
| 5,828,619 A | 10/1998 | Hirano et al. | 365/222 |
| 5,953,266 A | 9/1999 | Shore | 365/200 |
| 5,963,473 A | 10/1999 | Norman | 365/185.02 |
| 5,966,334 A | 10/1999 | Shore | 365/200 |
| 5,966,736 A | 10/1999 | Gittinger et al. | 711/207 |
| 5,974,573 A | 10/1999 | Martin | 714/48 |
| 5,978,952 A | 11/1999 | Hayek et al. | 714/764 |
| 5,982,697 A | 11/1999 | Williams et al. | 365/230.03 |
| 6,023,432 A | 2/2000 | Shore | 365/200 |
| 6,044,029 A | 3/2000 | Shore | 365/200 |
| 6,049,500 A | 4/2000 | Kajigaya et al. | 365/230.02 |
| 6,101,614 A | 8/2000 | Gonzales et al. | 714/6 |
| 6,104,641 A | 8/2000 | Itou | 365/189.01 |
| 6,134,167 A | 10/2000 | Atkinson | 365/222 |
| 6,154,851 A | 11/2000 | Sher et al. | 714/5 |
| 6,154,860 A | 11/2000 | Wright et al. | 714/718 |
| 6,191,995 B1 | 2/2001 | Huber et al. | 365/230.01 |
| 6,195,717 B1 | 2/2001 | Henderson et al. | 710/312 |
| 6,216,246 B1 | 4/2001 | Shau | 714/763 |
| 6,246,619 B1 | 6/2001 | Ematrudo et al. | 365/201 |
| 6,343,045 B1 | 1/2002 | Shau | 365/227 |
| 6,356,500 B1 | 3/2002 | Cloud et al. | 365/226 |
| 6,381,707 B1 | 4/2002 | Larsen et al. | 714/8 |
| 6,414,894 B1 | 7/2002 | Ooishi et al. | 365/222 |
| 6,438,057 B1 | 8/2002 | Ruckerbauer | 365/222 |
| 6,438,068 B1 | 8/2002 | Roohparvar | 365/238.5 |
| 6,449,203 B1 | 9/2002 | Cowles et al. | 365/222 |
| 6,452,859 B1 | 9/2002 | Shimano et al. | 365/230.06 |
| 6,510,528 B1 | 1/2003 | Freeman et al. | 714/6 |
| 6,519,201 B1 | 2/2003 | Cowles et al. | 365/222 |
| 6,528,974 B1 | 3/2003 | Mirov et al. | 323/267 |
| 6,532,180 B1 | 3/2003 | Ryan et al. | 365/195 |
| 6,549,476 B1 | 4/2003 | Pinney | 365/190 |
| 6,549,479 B1 | 4/2003 | Blodgett | 365/222 |
| 6,556,497 B1 | 4/2003 | Cowles et al. | 365/222 |
| 6,580,149 B1 | 6/2003 | Tran et al. | 257/549 |
| 6,608,476 B1 | 8/2003 | Mirov et al. | 324/103 R |
| 6,751,143 B1 * | 6/2004 | Morgan et al. | 365/222 |
| 6,751,159 B1 | 6/2004 | Farrell et al. | 36/238.5 |
| 6,838,331 B1 | 1/2005 | Klein | 438/238 |
| 6,839,300 B1 | 1/2005 | Cowles et al. | 365/230.01 |
| 6,857,457 B1 | 2/2005 | Nienhaus | 152/417 |
| 2002/0126558 A1 | 9/2002 | Cowles et al. | 365/222 |
| 2002/0126559 A1 | 9/2002 | Cowles et al. | 365/222 |
| 2002/0162076 A1 | 10/2002 | Talagala et al. | 714/819 |
| 2003/0067830 A1 | 4/2003 | Leung et al. | 365/222 |
| 2003/0081492 A1 | 5/2003 | Farrell et al. | 365/238.5 |
| 2003/0097608 A1 | 5/2003 | Rodeheffer et al. | 714/7 |
| 2004/0243886 A1 | 12/2004 | Klein | 714/42 |

OTHER PUBLICATIONS

Applicants also wish to make known that an application, U.S. Appl. No. 10/039,815, describing and claiming subject matter that is similar to the subject matter of this application, was filed on Oct. 26, 2001. This related application, as well as any prior art cited therein, may be material to the examination of this application. A copy of this related application as filed is submitted herewith in accordance with 37 C.F.R § 1.98(d).

Applicants also wish to make known that an application, U.S. Appl. No. 10/119,550, describing and claiming subject matter that is similar to the subject matter of this application, was filed on Apr. 9, 2002. This related application, as well as any prior art cited therein, may be material to the examination of this application. A copy of this related application as filed is submitted hrerewith in accordance with 37 C.F.R. § 1.98(d).

Applicants also wish to make known that an application, U.S. Appl. No. 10/043,680, describing and claiming subject matter that is similar to the subject matter of this application, was filed on Jan. 10, 2002. This related application, which is a divisional of U.S. Appl. No. 09/803,365, filed Mar. 8, 2001, issued as U.S. Patent No. 6449203, as well as any prior art cited therein, may be material to the examination of this application. A copy of this related application as filed is submitted herewith in accordance with 37 C.F.R. § 1.98(d).

Applicants also wish to make known that an application, U.S. Appl. No. 10/043,682, describing and claiming subject matter that is similar to the subject matter of this application, was filed on Jan. 10, 2002. This related application, which is divisional of U.S. Appl. No. 09/803,365, filed Mar. 8, 2001, issed as U.S. Patent No. 6,449,203, as well as any prior art cited therein, may be material to the examination of this application. A copy of this related application as filed is submitted herewith in accordance with 37 C.F.R. § 1.98(d).

Applicants also wish to make known that an application, U.S. Appl. No. 10/410,575, describing and claiming subject matter that is similar to the subject matter of this application, was filed on Apr. 8, 2003. This related application, which is a continuation of U.S. Appl. No. 10/043,462, filed Jan. 10, 2002, issued as U.S. Patent No. 6.556,497, as well as any prior art cited therein, may be material to the examination of this application. A copy of this related application as filed is submitted herewith in accordance with 37 C.F.F. § 1.98(d).

* cited by examiner

| ROW ADDRESS | ROW |
|---|---|
| 0 | 0 |
| 32 | 1 |
| 1 | 2 |
| 33 | 3 |
| 2 | 4 |
| 34 | 5 |
| 3 | 6 |
| 35 | 7 |
| ⋮ | ⋮ |
| 15 | 30 |
| 47 | 31 |
| 16 | 32 |
| 48 | 33 |
| 30 | 60 |
| 62 | 61 |
| 31 | 62 |
| 63 | 63 |

METHOD AND SYSTEM FOR LOW POWER REFRESH OF DYNAMIC RANDOM ACCESS MEMORIES

CROSS-REFERENCE TO RELATED APPLICATION

This application is a divisional of U.S. patent application Ser. No. 10/122,943, filed Apr. 11, 2002 now U.S. Pat. No. 6,751,143.

TECHNICAL FIELD

This invention relates to dynamic random access memory devices, and, more particularly, to a method and system for allowing a memory device to be quickly and easily switched into and out of a low power, half density, operating mode.

BACKGROUND OF THE INVENTION

As the use of electronic devices, such as personal computers, continue to increase, it is becoming ever more important to make such devices portable. The usefulness of portable electronic devices, such as notebook computers, is the limited by the limited length of time batteries are capable of powering the device before needing to be recharged. This problem has been addressed by attempts to increase battery life and attempts to reduce the rate at which such electronic devices consume power.

Various techniques have been used to reduce power consumption in electronic devices, the nature of which often depends upon the type of power consuming electronic circuits that are in the device. For example, electronic devices, such a notebook computers, typically include dynamic random access memory ("DRAM") devices that consume a substantial amount of power. As the data storage capacity and operating speeds of DRAM devices continues to increase, the power consumed by such devices has continued to increase in a corresponding manner.

A variety of operations are performed in DRAM devices, each of which affects the rate at which the DRAM device consumes power. One operation that tends to consume power at a substantial rate is refresh of memory cells in the DRAM device. As is well-known in the art, DRAM memory cells, each of which essentially consists of a capacitor, must be periodically refreshed to retain data stored in the DRAM device. Refresh is typically performed by essentially reading data bits from the memory cells in each row of a memory cell array and then writing those same data bits back to the same cells in the row. This refresh is generally performed on a row-by-row basis at a rate needed to keep charge stored in the memory cells from leaking excessively between refreshes. Since refresh essentially involves reading data bits from and writing data bits to a large number of memory cells refresh tends to be a particularly power-hungry operation. Thus many attempts to reduce power consumption in DRAM devices have focused on reducing the rate at which power is consumed during refresh.

The amount of power consumed by refresh also depends on which of several refresh modes is active. A Self Refresh mode is normally active during periods when data are not being read from or written to the DRAM device. Since portable electronic devices are often inactive for substantial periods of time, the amount of power consumed during Self Refresh can be an important factor in determining how long the electronic device can be used between battery charges.

One technique that has been used to reduce the amount of power consumed by refreshing DRAM memory cells is to vary the refresh rate as a function of temperature. As is well known in the art, the rate at which charge leaks from a DRAM memory cell increases with temperature. The refresh rate must be sufficiently high to ensure that no data is lost at the highest temperature in the specified range of operating temperatures of the DRAM device. Yet, DRAM devices normally operate at a temperature that is substantially lower than their maximum operating temperature. Therefore, DRAM devices are generally refreshed at a rate that is higher than the rate actually needed to prevent data from being lost, and, as a result, unnecessarily consume power. To address this problem, some commercially available DRAM devices allow the user to program a mode register to select a lower maximum operating temperature. The DRAM device then adjusts the refresh rate to correspond to the maximum operating temperature selected by the user.

Although adjusting the refresh rate as a function of temperature does reduce the rate of power consumed by refresh, it nevertheless still allows power to be consumed at a significant rate for several reasons. For example, although the refresh rate may be reduced with reduced maximum operating temperature, the refresh may still result in refreshing a large number of memory cells that are not actually storing data.

Another approach to reducing the rate at which power is consumed by a refresh operation is to refresh less than all of the memory cells in the DRAM device in attempt to refresh only those memory cells needed to store data for a given application. As described in U.S. Pat. No. 5,148,546 to Blodgett, a software program being executed in a computer system containing the DRAM devices is analyzed to determine the data storage requirements for the program. The DRAM device then refreshed only those rows of memory cells that are needed to store data. In another approach, the DRAM device may be operated in a partial array self refresh ("PASR") mode. In the PASR mode, a mode register is programmed by a user to specify a bank or portion thereof of memory cells that will be used and thus must be refreshed. The remaining memory cells are not used and thus need not be refreshed during at least some refresh modes. Although these techniques for refreshing less than all of the memory cells in a memory device can substantially reduce the rate of power consumption, it can nevertheless require a substantial amount of power to refresh the cells that are to be refreshed.

Still another technique that can be used to reduce the rate of refresh involves operating DRAM devices in a half density mode. A DRAM device that may be operated in a half density mode is described in U.S. Pat. No. 5,781,483 to Shore. In the half density mode, the low order bit of each row address, which normally designates whether the addressed row is even or odd, is ignored, and both the odd row and adjacent even row are addressed for each memory access. In a folded digit line architecture, activating an odd row will couple each memory cell in the row to a respective digit line, and activating an even row will couple each memory cell in the row to a respective complimentary digit line. Thus, for example, writing a "1" to an addressed row and column would result in writing a logic "1" voltage level to the memory cell in the addressed odd row and writing a logic "0" logic level to the memory cell in the addressed even row. Reading from the addressed row and column results in a logic "1" voltage level being applied to the digit line for the addressed column and a logic "0" voltage level being applied to the complimentary digit line for the addressed column. Therefore, in the half density mode, a sense amplifierlifier coupled to the digit line and complimentary digit line for each column receives twice the differential voltage that it normally receives when reading a memory cell at an addressed row and column.

The patent to Shore describes the use of the half density mode for the purpose of allowing the DRAM device to be used despite the presence of defective memory cells. If a memory cell in an addressed row and column is defective, the data bit stored in that memory cell can still be recovered from the other memory cell in the addressed row and column. However, it has been recognized that the half density mode can be used to reduce that rate at which power is consumed during refresh. Although a refresh in the half density mode requires twice as many memory cells to be refreshed for a given amount of stored data, the required refresh rate is less than half the required refresh rate when the DRAM device is operating in the full density mode. The substantially lower refresh rate required in the half density results from the increased differential voltage that is applied to the sense amplifierlifiers in the half density mode, as previously explained. As a result, the memory cells can be allowed to discharge to a greater degree between refreshes without the data bits stored therein being lost. Therefore, storing data in the half density mode can reduce the rate of power consumption during refresh In conventional DRAM devices, the density mode, i.e., either half or full, is generally determined prior to sale of the device. If the power consumption of the DRAM device is of concern, the half density mode can be selected. Otherwise, the full density mode can be selected. Yet many power management algorithms for electronic devices containing DRAM devices, such as notebook computers, switch to a low power mode when the electronic device is inactive and back to a high power mode when the electronic device is active. It is therefore necessary for electronic devices to be able to frequently switch back and forth between low power and high power modes.

In conventional DRAM devices, it is not possible to switch between a full density mode and a half density mode. This limitation may be due to the difficulty in making this transition. The difficulty of being able to rapidly switch between the full density mode and the half density mode primarily results from two requirements. First is the need to first free-up alternate rows of memory cells into which data from an adjacent row of memory cells can be transferred for half density storage. The second requirement is the need to transfer data from the memory cells in a row storing data to a memory cell in the adjacent row once the adjacent row has been freed up by transferring data to another row. More particularly, if the DRAM device is operating in the full density mode, generally data will be stored in both even rows and odd rows of memory cells. To switch to the half density mode would require that the data stored in the even rows of memory cells, for example, be transferred to empty odd rows of memory cells. It would then be necessary to read the data stored in each odd row, and write the read data to corresponding memory cells in the adjacent even row. Transferring data between memory cells in this manner by conventional read/write operations would require a great deal of time and would therefore preclude quickly switching back and forth between the full density mode and the half density mode. Also, transferring approximately half of the data stored in the DRAM device by conventional read/write operations, which would be necessary to switch from the full density mode to the half density mode, would itself consume a great deal of power. While more efficient row copy schemes have been proposed for test purposes, such as the row copy scheme described in U.S. Pat. No. 5,381,368 to Morgan et al., these row copy schemes are generally suitable only when the same data or a repeating pattern of data are to be written to the entire array of memory cells. Yet switching from the full density mode to the half density mode would require transferring many rows of disparate data bits to respective adjacent rows after freeing up the adjacent rows by transferring the disparate data bits to other rows. It therefore does not seem possible to easily transition between the half density mode and the full density mode.

There is therefore a need for a power-saving technique that would allow switching into and out of a half density, low refresh rate mode without requiring time and power consuming reading and writing of data to a second set of memory cells.

SUMMARY OF THE INVENTION

A system and method according to the invention allows a DRAM device to be easily and quickly switched back and forth between a full density mode consuming power at a relatively fast rate and a half density mode consuming power at a relatively slow rate. The row addresses applied to the DRAM device are reordered by remapping the most significant bit of each row address to the least significant bit of the row address during all operating modes. As a result, all of the odd (or even) rows of the DRAM array are populated with data before any of the even (or odd) rows are populated with data. As long as the data stored in the DRAM device uses less than half of the capacity of the DRAM device, data will then be stored only in alternate rows, and the row adjacent each row in which data are stored will be free to store data. When the DRAM device is to be switched from the full density mode to the half density mode, data stored in each row is simply transferred to the adjacent row. Thereafter when operating in the half density mode, the row corresponding to each row address and the adjacent row are accessed at the same time. Although the data stored in each row can be transferred to the adjacent row by a variety of techniques, it is preferably transferred by transferring the data from each row to the adjacent row during the first refresh of the row. More particularly, when a row is first refreshed after the DRAM device has been switched to the half density mode, the sense amplifierlifiers are left active so that the voltage levels corresponding to the data stored in the memory cells being refreshed are maintained on the respective digit line pairs. The adjacent row is then activated thereby transferring the voltage on the digit lines to the memory cells in the adjacent row. Once the data have been transferred to the adjacent rows during refresh at the full density refresh rate, the refresh rate can be significantly reduced during operation in the half density mode.

BRIEF DESCRIPTION OF THE DRAWINGS

FIG. 3 is a specific example of a memory map using the row addressing scheme shown in the memory map of FIG. 2.

DETAILED DESCRIPTION OF THE INVENTION

Figure 1:
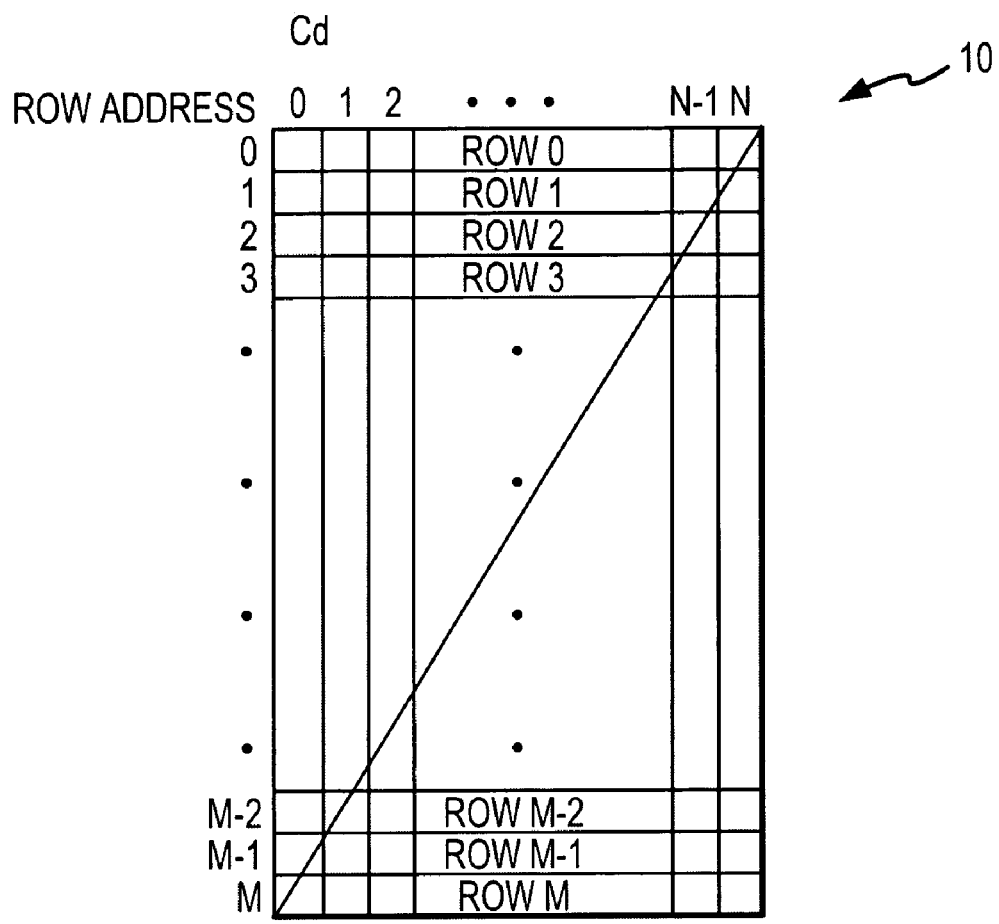
FIG. 1 is a memory map showing the addressing scheme of a DRAM device operating in a conventional manner.

A memory map 10 for a conventional DRAM device (not shown) is shown in FIG. 1. The memory map 10 illustrates how the physical locations in an array of memory cells (not shown) in the DRAM device correspond to row and column addresses that may be applied to the DRAM device. The row and column addresses are normally binary numbers that are decoded by the DRAM to select the corresponding row or column. It is assumed for purposes of illustration that the array of memory cells that will be discussed with reference to FIG. 1 consists of M+1 rows and N+1 columns. The memory cell that is in the upper left hand corner is selected by a row address of 0 and a column address of 0. The memory cell in the upper right hand corner is selected by a row address of 0 and a column address of N. The memory cell in the lower left hand corner is selected by a row address of M and a column address of 0. The memory cell in the lower right hand corner is selected by a row address of M and a column address of N. As shown in FIG. 1, the rows are physically arranged in sequential order, and so are the row addresses. Therefore, the selected rows identically correspond to the row addresses.

Data are often written to the rows of memory cells in a DRAM array in numerical order. As a result, data written to the DRAM device first populates the memory cells in row 0, then the memory cells in row 1, then the memory cells in row 2, etc. The presence of valid data in adjacent rows is the primary reason why it would be very time consuming to switch from the full density mode to the half density mode, as previously explained. Since data will generally be stored in row 1, it would not be possible to simply transfer the data from row 0 to row 1. Instead, that data stored in the memory cells in row 1 must first be read from row 1 and then written to unused memory cells in another row. Only then can the data in row 0 be transferred to row 1. As mentioned earlier, transferring a large block of data in this manner is time consuming and requires a relatively large amount of power.

Figure 2:
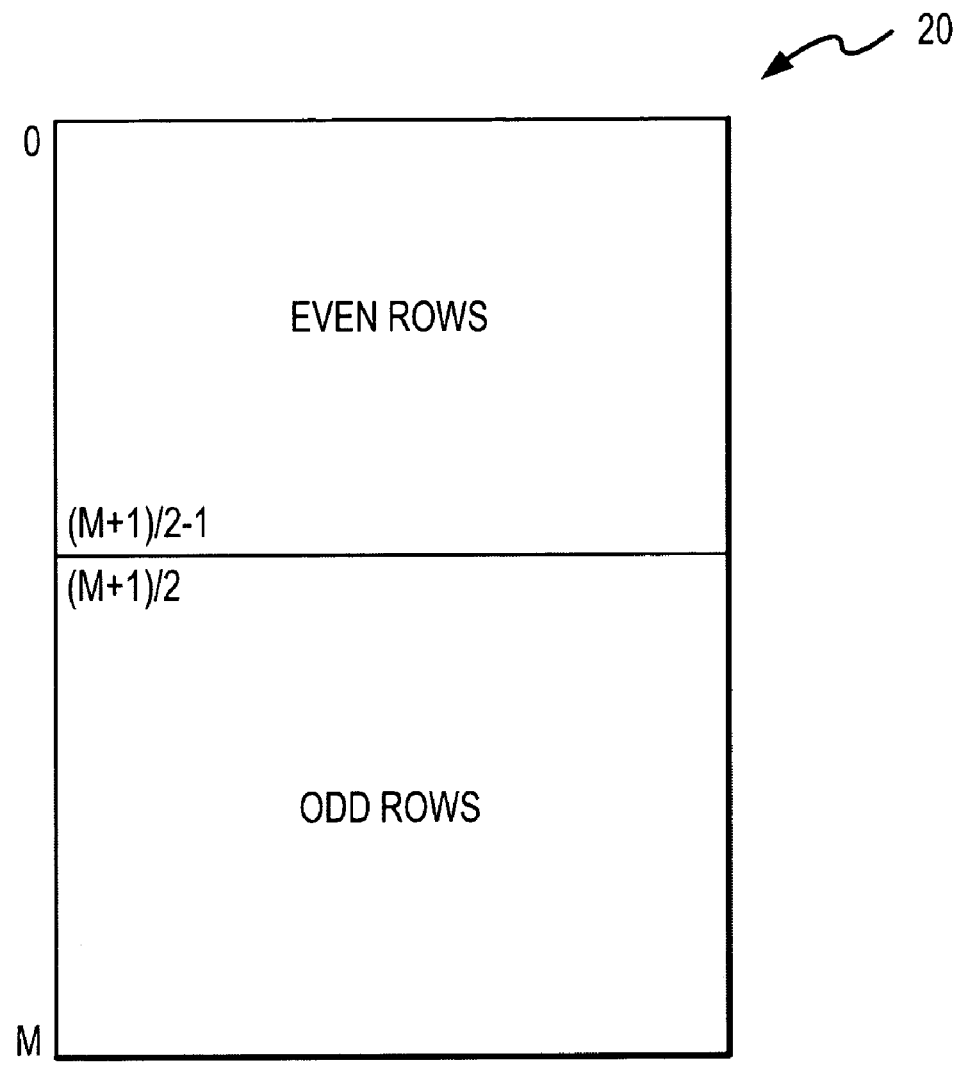
FIG. 2 is a memory map showing the addressing scheme of a DRAM device operating according to one embodiment of the invention by reordering row addresses.

A memory map 20 showing the organization of memory cells in a DRAM device according to one embodiment of the invention is shown in FIG. 2. In this embodiment of a DRAM device, the row addresses are remapped so that the lowest numbered row addresses select all of the even rows, and the highest numbered row addresses select all of the odd rows. Thus, the even rows are activated responsive to row addresses ("RA") from RA=0 to RA=((M+1)/2)−1, and the odd rows are activated responsive to row addresses from RA=(M+1)/2 to RA=M. Significantly, data written to the DRAM device normally first populates the memory cells in row 0, then the memory cells in row 2, then the memory cells in row 4, etc. Data would not be written to any of the odd rows in the array until more than half the memory capacity of the array was being used. Therefore, as long as less than half the capacity of the array is being used, data would be stored only in the even rows, and the adjacent odd rows would be available to store a redundant copy of the data stored in the even rows.

One technique for organizing a DRAM array as shown by the memory map 20 of FIG. 2 is to reorder the bits of the row address by mapping the most significant bit ("MSB") of the row address to the least significant bit ("LSB") of the row address, and then mapping all of the remaining bits of the row address to the next highest order bit. Thus, a row address containing bits "N,N−1,N−2 . . . 2,1,0" would be remapped to a row address of "N−1, N−2 . . . 2,1,0, N" where N is the MSB and 0 is the LSB of the original row address. For example, consider an array containing 64 rows (actual DRAM arrays would, of course, generally include many more rows of memory cells). A memory map 30 for such a DRAM array is shown in FIG. 3. The row addresses applied to the DRAM device would be mapped as shown in Table 1:

TABLE 1

| Original Row Addr. (Binary) | Original Row Addr. (Decimal) | Mapped Row Addr. (Binary) | Mapped Row Addr. (Decimal) |
| --- | --- | --- | --- |
| 0,0,0,0,0,0 | 0  | 0,0,0,0,0,0 | 0  |
| 0,0,0,0,0,1 | 1  | 0,0,0,0,1,0 | 2  |
| 0,0,0,0,1,0 | 2  | 0,0,0,1,0,0 | 4  |
| 0,0,0,0,1,1 | 3  | 0,0,0,1,1,0 | 6  |
| 0,1,1,1,1,0 | 30 | 1,1,1,1,0,0 | 60 |
| 0,1,1,1,1,1 | 31 | 1,1,1,1,1,0 | 62 |
| 1,0,0,0,0,0 | 32 | 0,0,0,0,0,1 | 1  |
| 1,0,0,0,0,1 | 33 | 0,0,0,0,1,1 | 3  |
| 1,1,1,1,1,0 | 62 | 1,1,1,1,0,1 | 61 |
| 1,1,1,1,1,1 | 63 | 1,1,1,1,1,1 | 63 |

As shown in Table 1, consecutive row addresses are mapped to addresses for consecutive even rows until row address 31, which is mapped to row address 62. At this point, half of the rows have been mapped. Row address 32, the next row address in chronological sequence, is mapped to row 1. Thus, it is not until row 32 has been addressed that data are stored in any odd row. Thereafter, consecutive row addresses are mapped to consecutive odd rows until row 63 is mapped to row address 63.

Organizing the memory as explained with reference to FIGS. 2 and 3 provides several advantages. First, as previously explained, data are not stored in the memory cells of the odd rows until at least half the memory capacity of the DRAM array has been used. At this point, of course, the half density mode could not be used because the capacity of the DRAM array in the half density mode is only half the capacity in the normal mode. The absence of data in the memory cells of the odd rows leaves the odd rows available to store data from the adjacent even rows, which can be done quickly and efficiently in a row copy procedure that will be explained below. The second advantage of the above-described memory storage organization is that it is not necessary to alter the memory storage organization when switching from the half density mode to the full density mode. More specifically, the data stored in the DRAM array is accessible at the same addresses in the full density mode as it was in the half density mode. Therefore, there is no need to transfer data from one row of memory cells to another when transitioning from the half density mode to the full density mode.

Figure 4:
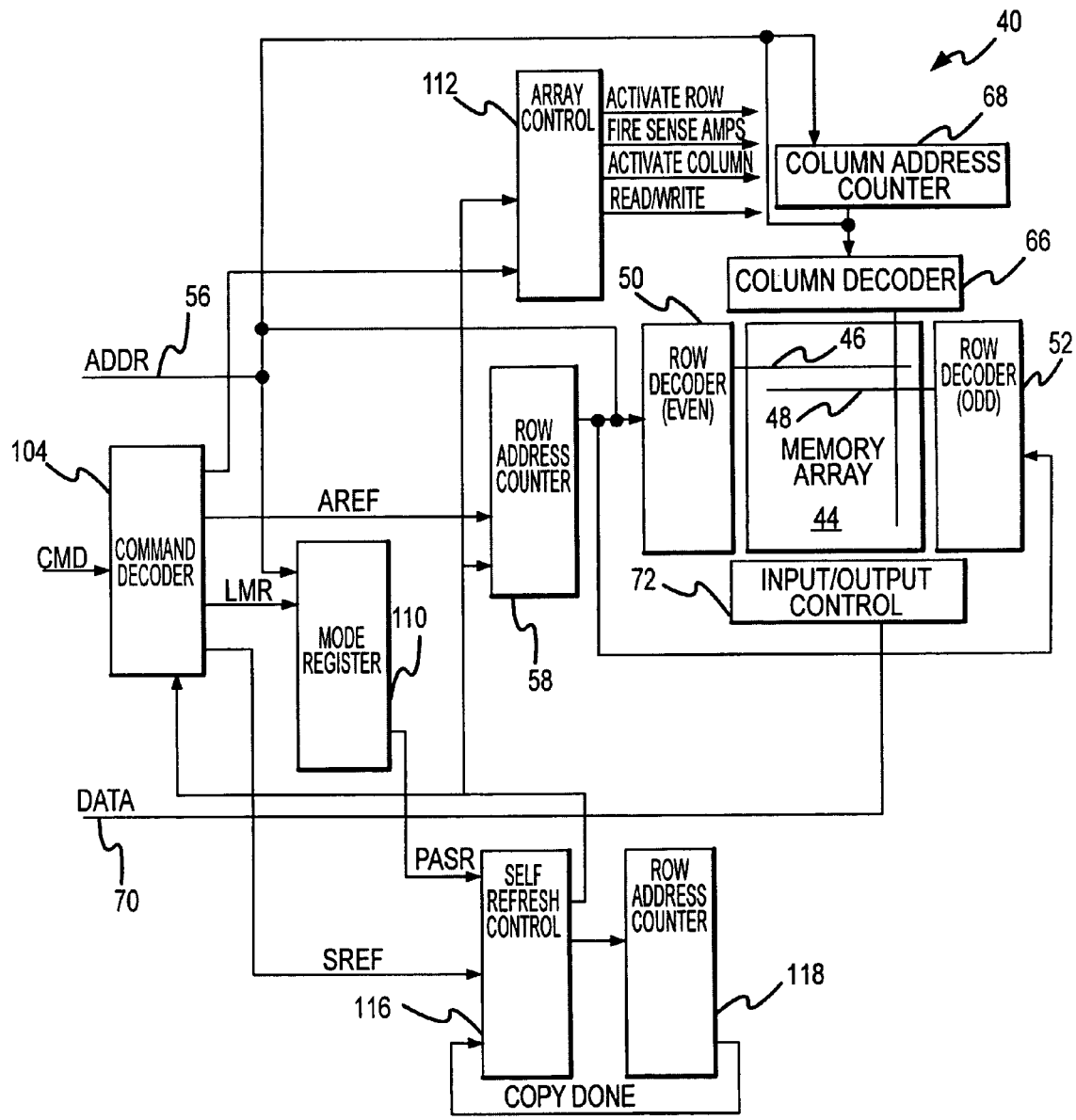
FIG. 4 is a block diagram and schematic of one embodiment of a system and method for allowing a DRAM device to be operated in a low power, half density mode in a manner that allows switching back and forth to a high power, full density mode.

One embodiment of a DRAM device 40 according to one embodiment of the invention is shown in FIG. 4. The DRAM device 40 is shown in simplified form, it being understood that DRAM devices typically include a large number of other components, which have been omitted from FIG. 4 in the interests of brevity and clarity. The DRAM device 40 includes a DRAM memory array 44 of conventional design. The array 44 includes memory cells arranged in rows and columns. The rows of memory cells are activated by a respective word line, two of which 46, 48 are shown in FIG. 4, although it will be understood that the memory array 44 will normally include a much larger number of word lines. The word line 46 is an even-numbered word line, which, like all of the other even-numbered word lines, is coupled to a respective even row decoder 50. Similarly, the word line 48 is an odd-numbered word line that is connected to a respective odd row decoder 52 along with all of the other odd-numbered word lines. The row decoders 50, 52 receive either external row addresses through an address bus 56 or internal row addresses from a row address counter 58 of conventional design. The row decoders 50, 52 activate each of a large number of word lines for respective rows of the array 44. The row decoders 50, 52 also map the most significant bit of the row address to the least significant bit of the row address, and they also map all of the remaining bits of the row address to the next highest order bit, as previously explained. However, it will be understood that this mapping or reordering function can alternatively be accomplished by other components in the DRAM device 40.

Specific memory cells in an active row are selected by a column decoder 66 responsive to either an external column address received through the address bus 56 or internal column addresses received from a column address counter 68. The column address counter 68 is used in a burst mode to sequentially access several columns starting from a column designated by an externally applied column address. Data from memory cells selected by row and column addresses are coupled between the memory array 44 and a data bus 70 by an Input/Output Control circuit 72.

Figure 5:
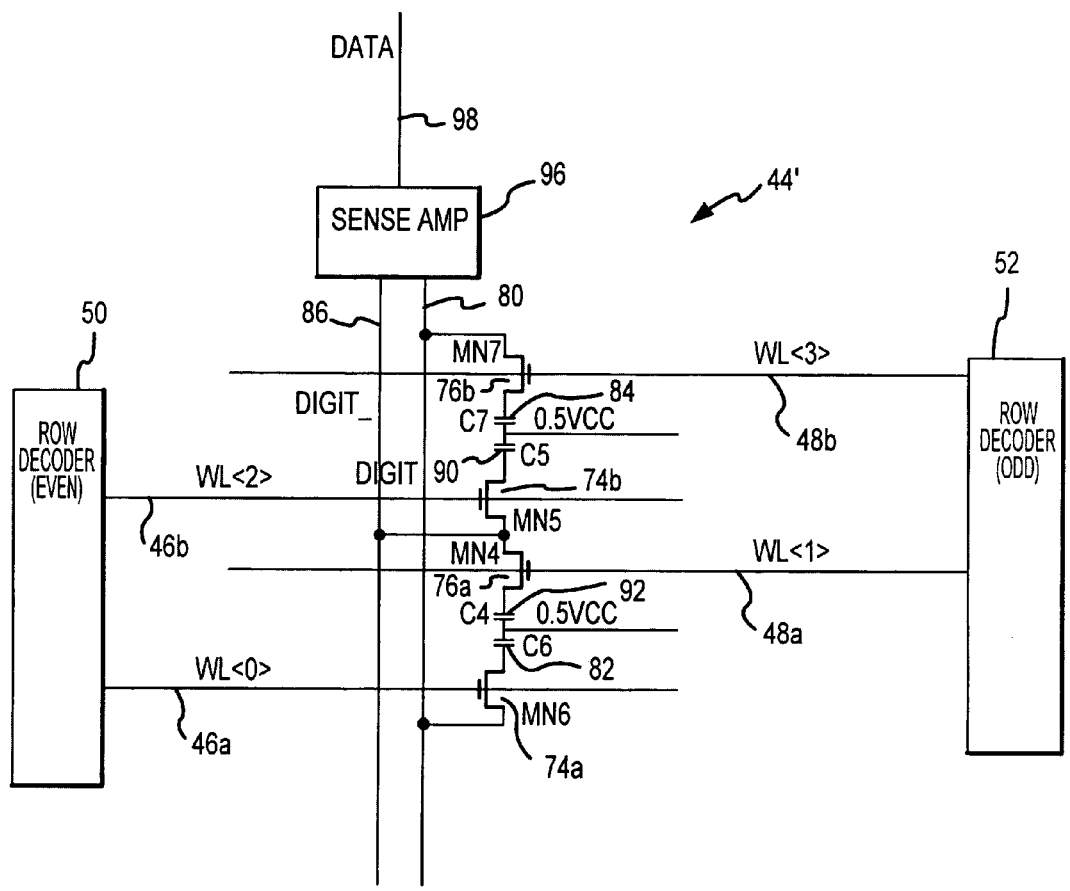
FIG. 5 is a block diagram and schematic of one embodiment of a memory array topography that may be used in the DRAM device of FIG. 4.

One embodiment of the memory array 44 is shown in greater detail in FIG. 5. The even numbered word lines 46a,b are coupled to the gates of respective access transistors 74a,b, and the odd-numbered word lines 48a,b are coupled to the gates of respective access transistors 76a,b. The access transistors 74a, 76b are coupled between a digit line 80 and a respective memory cell capacitor 82, 84. The opposite plate of the memory cell capacitors 82, 84 normally constitute a common "cell plate" that is biased at 0.5 $V_{CC}$. Similarly, the access transistors 74b, 76a are coupled between a complementary digit line 86 and a respective memory cell capacitor 90, 92. The digit lines 80, 86 are coupled to a sense amplifier 96, which outputs data on a data line 98. One sense amplifier 96 is provided for each column of memory cells in the array 44, and the sense amplifiers 96 may be included in the Input/Output Control circuit 72.

In operation in the normal mode, data bits are written to the memory cell capacitors 82, 84, 90, 92 by causing one of the row decoders 50, 52 to actuate one of the word lines 46, 48 and then driving one of the digit lines 80, 86 to either 0 volts or $V_{CC}$. The voltage on one of the digit lines 80, 86 is thereby transferred to one of the memory cell capacitors 82, 84, 90, 92. Data bits are read from the memory cell capacitors 82, 84, 90, 92 by equilibrating the digit lines 80, 86 to 0.5 $V_{CC}$, then causing one of the row decoders 50, 52 to actuate one of the word lines 46, 48, and then enabling the sense amplifier 96. The charge of the memory cell capacitor, which is at either 0 volts or $V_{CC}$ (or some voltage between 0 volts and $V_{CC}$ if the memory cell has not been refreshed recently), is then coupled through one of the access transistors 74, 76 to one of the digit lines 80, 86. The capacitor then charges or discharges the digit line 80, 86 below or above 0.5 $V_{CC}$. The other digit line 80, 86 that is not coupled to a memory cell capacitor will remain at the 0.5 $V_{CC}$ voltage to which it was originally set during equilibration. The sense amplifier 96 responds to the increase or decrease in voltage coupled to one of the digit lines 80, 86 by driving the digit lines 80, 86 to opposite voltages (0 volts and $V_{CC}$) and outputs a corresponding data bit on the data line 98.

As previously explained, charge can leak from the memory cell capacitors 82, 84, 90, 92 so that the data bits stored therein become unreadable unless they are refreshed at a fairly frequent interval. During refresh, each of the word lines 46, 48 is sequentially activated and the sense amplifier 96 for each column is energized to recharge or discharge the memory cell capacitors 82, 84, 90, 92. Because of the large number of memory cells in a conventional DRAM array 44, refreshing in the memory cells can require substantial current.

In operation in the low power, half density mode, data bits are stored in the memory cell capacitors 82, 84, 90, 92 in the same manner as described for the normal operating mode. However, in order for the DRAM device 40 to be operable in the half density mode, the data stored in the DRAM device 40 must occupy less than half of its capacity. Under the circumstances, data will be stored only in the memory cells coupled to the even-numbered word lines. The data bit stored in each memory cell in each of the even-numbered rows is written to the memory cell in the same column of the adjacent odd-numbered row. Thus, for example, if the memory cell capacitor 82 has been charged to $V_{CC}$ indicative of a binary "1" data bit stored in the memory cell capacitor 82, the memory cell capacitor 92 in the adjacent odd-numbered row will be discharged to 0 volts. Charging the memory cell capacitor 92 to 0 volts is also indicative of a binary "1" data bit stored in the memory cell capacitor 92 since the memory cell capacitor 92 is coupled to the complementary digit line 86. When data are read from the memory array 44, the even-numbered word line 46a and the odd-numbered word line 48a are activated at the same time. The charge on the memory cell capacitor 82, which is at $V_{CC}$, is then coupled through the access transistor 74a to the digit line 80, and the lack of charge on the memory cell capacitor 92, which is at 0 volts, is then coupled through the access transistors 76a to the complimentary digit line 86. The differential voltage applied to the sense amplifier 96 will thus be twice the voltage applied to the sense amplifier during a read operation in the normal operating mode. As a result of this increased differential voltage applied to the sense amplifier 96, the charge on the memory cell capacitors 82, 92 can be permitted to change to a greater extent without a loss of data. The time between refreshing the memory cell capacitors 82, 92 can therefore be substantially increased. Alternatively, data could be stored in the full density mode only in the memory cells coupled to the odd-numbered word lines, and, in transitioning to the half density mode, the data could be transferred to the memory cells coupled to the even-numbered memory cells.

Figure 6:
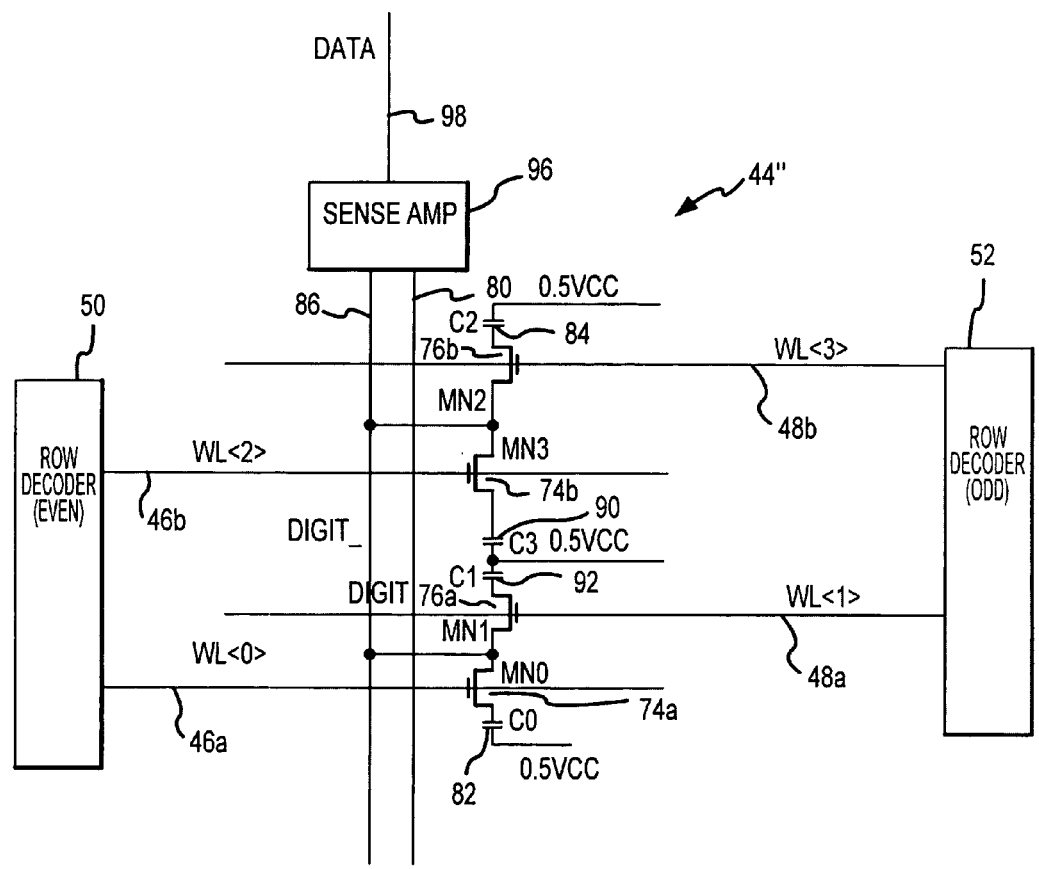
FIG. 6 is a block diagram and schematic of another embodiment of a memory array topography that may be used in the DRAM device of FIG. 4.

Another embodiment of a memory array 44" is shown in FIG. 6 in which the component shown therein have been designated using the same reference numerals that were used to designate those same components in FIG. 5. The array 44" of FIG. 6 differs from the array 44" of FIG. 5 by coupling the memory cells in adjacent rows to the same digit line 80, 86 rather than two different complementary digit lines, as shown in FIG. 5. The memory array 44" functions in substantially the same manner as the memory array 44' in the normal, full-density mode. However, in the low power, half-density mode, since both memory cell capacitors 82, 92 are coupled to the same digit line 80, the change in voltage when the capacitors 82, 92 are coupled to the digit line 80 is twice the change in voltage when a single capacitor 82, 92 is coupled to the digit line 80 in the normal operating mode. As a result, the charge on the memory cell capacitors 82, 92 can be permitted to change by a greater amount than in the full density operating mode. The time between refreshes can therefore be significantly longer in the low power, half-density mode.

Returning, now, to FIG. 4, in operation during the high power, full density mode, row addresses are applied to the row decoders 50, 52 to access a specific row of memory cells, and a column address is applied to the column decoder 66 to select one or more columns of data, which are route&f to or from the memory array 44 through the Input/Output Control circuit 72 and data bus 70. The operation of the DRAM device 40 is controlled by a command decoder 104 that decodes conventional high-order memory commands to generate a number of control signals. These control signals include a load mode register "LMR" signal that causes mode bits on the address bus 56 to be loaded into a mode register 110, and "AREF" and "SREF" control signals that cause the DRAM device 40 to operate in either an Auto Refresh or a Self Refresh mode, as will be explained in greater detail below. The command decoder 104 also generates control signals that are applied to an array control circuit 112. The array control circuit 112, in turn, generates control signals with the proper timing to perform a number functions in the memory array 44. These control signals include an "Activate Row" signal that activates a row of memory cells selected by a row address as decoded by a row decoder 50, 52, a "Fire Sense amplifiers" signal that energizes sense amplifiers 96 (FIGS. 5 and 6), an "Activate Column" signal that causes data bits to be coupled from respective memory cells in an addressed column, and a "Read/Write" signal that determines whether a memory access will write data to or read data from the memory array 44. Other signals may also be generated, but a description of these signals have been omitted in the interest of brevity.

As previously explained, it is necessary to periodically refresh the memory cells in the array 44. The memory cells may be refreshed in the active mode by the command decoder 104 decoding an Auto Refresh command applied to the DRAM device 40. The command decoder 104 then causes the Array Control circuit 112 to generate appropriate control signals to refresh the memory cells in the array 44 one row at a time. The rows are selected for refresh by respective row addresses generated by the Row Address Counter 58 responsive to the AREF control signal generated by the command decoder 104. In subsequent AREF cycles, the Counter 58 is incremented once for each Auto Refresh command to generate respective row addresses for each row of memory cells that causes the row decoders 50, 52 to activate respective word lines.

The memory cells in the array 44 may be refreshed by the command decoder 104 applying the SREF control signal to a Self Refresh Control circuit 116, which, in turn, causes an internal timer to periodically increment the Row Address Counter 58. The Row Address Counter 58 then generates respective row addresses for each row of memory cells. Once the DRAM device 40 is placed in the Self Refresh mode responsive to a decoded SREF signal, the Self Refresh Control circuit 116 will remain in the Self Refresh mode until it is taken out of that mode responsive to an appropriate memory command being applied to the command decoder 104. In the Self Refresh mode, the Self Refresh Control circuit 116 supplies a signal to the Array Control circuit 112 to cause the circuit 112 to generate control signals to activate a row of memory cells corresponding to the row address generated by the Counter 58 and to energize a sense amplifier for each column of memory cells. The Self Refresh mode is thus similar to the Auto Refresh mode except that, in the Self Refresh mode, the command signal to begin each refresh cycle is generated internally by the Self Refresh Control circuit 116 rather than by an external Auto Refresh command. The ability of the DRAM device 40 to remain in the Self Refresh mode without any external input is the primary reason that the Self Refresh mode is typically used when the DRAM device 40 is inactive. When the DRAM device 40 is inactive, many of the circuits in the DRAM device 40 are also often deenergized to reduce the power consumed by the DRAM device 40.

The Self Refresh Control circuit 116 is also coupled to a Row Address Counter 118 that is used in transitioning to the low power, half density mode in accordance with an embodiment of the invention. More specifically, when transitioning to the half density mode, the counter 118 is reset and then increments responsive to each refresh as data from each even-numbered row of memory cells are copied to adjacent odd-numbered row of memory cells. The Row Address Counter 118 thus keeps track of the number of even-numbered rows that have been copied to adjacent odd-numbered rows to determine when the transition to the half density mode is complete. When all of the data stored in the even-numbered rows have been copied to the odd-numbered rows, the Row Address Counter 118 outputs a COPY DONE signal to the Self Refresh Control circuit 116. The manner in which the circuit 116 transitions to the low power, half density mode will now be explained with reference to the flowchart of FIG. 7. The low power, half density mode is entered at 140 responsive to the DRAM device 40 becoming inactive if the Self Refresh Control circuit 116 (FIG. 4) was previously enabled by a PASR signal from the mode register 110. The mode register 110 generates the PASR signal responsive to the command decoder 104 receiving a load mode register command while a bit pattern is placed on the address bus 56 that selects operation in the low power mode. The command decoder 104 then generates an LMR signal that loads the bit pattern into the Mode Register 110.

Returning to FIG. 7, a count Y for the Row Address Counter 118 is set to zero at 150, and an even-numbered row N corresponding to a count from the Counter 58 is activated at 152 by causing the Array Control circuit 112 to generate an Activate Row signal. The count of the counter will be at whatever count was reached at the end of the prior refresh. However, for the present example, it will be assumed that the Counter 58 initially generates a count for Row 0. Activating row 0 causes the memory cells in row 0 to be coupled to respective digit lines 80 or 86 (FIGS. 5 and 6). The voltage applied to one of the digit lines by a memory cell capacitor in each column is sensed by a respective sense amplifier 96 after the sense amplifier 96 is energized at 154. Respective sense amplifiers 96 for each column then drive the pairs of digit lines 80, 86 for each column to opposite voltages (0 volts and $V_{CC}$) corresponding to the data bits stored in the memory cell in that column of the active row. The adjacent row N+1, which, in the present example, is initially row 1, is then activated at 158, thereby charging or discharging the memory cell capacitors for each column in the adjacent row to a voltage value corresponding to the data bits stored in the respective column for row N. Both rows N and N+1 are then deactivated at 160 and the sense amplifiers 96 are deenergized at 162. At this time, the data that was stored in row 0 is now also stored in row 1. The above copy procedure is performed each time a row of memory cells is to be refreshed, which, for the Self Refresh mode, is determined by an internal timer (not shown).

Figure 8:
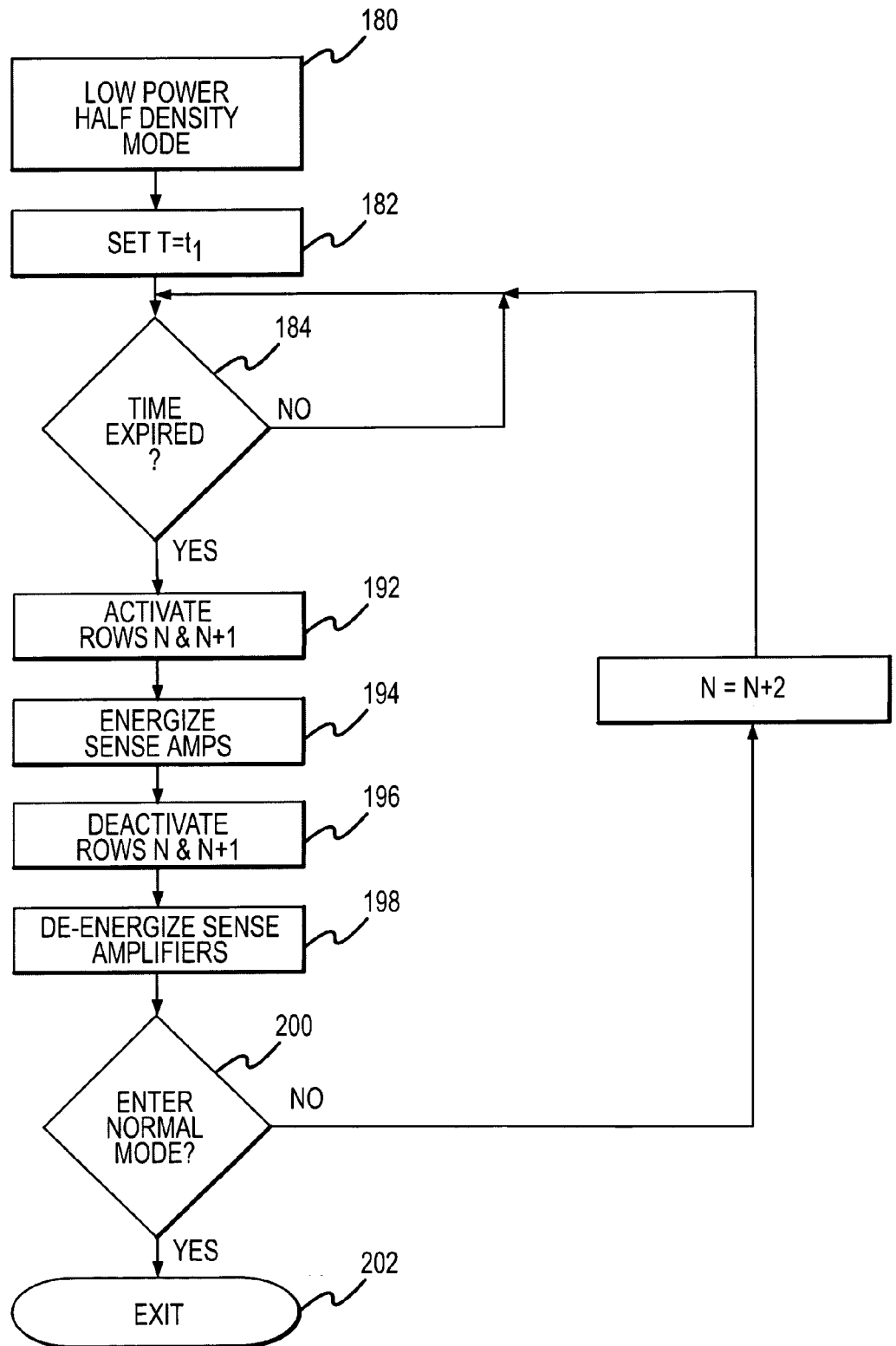
FIG. 8 is a flowchart showing the operation of the DRAM device of FIG. 4 in the low power, half density mode.

A determination is made at 166 as to whether the final row of the memory array 40 has been reached, which, as previously explained, is indicated by the Row Address Counter 118 generating the COPY DONE signal. Initially, of course, the final row will not have been reached so that the Row Address Counter 58 is incremented by two rows at 168. The process then returns and repeats steps 152–162 to copy the data from each even row to the adjacent odd row. Data from an even row is ultimately written to the final odd row of the memory array 44, and a determination is then made at 166 that $Y=Y_{MAX}$ responsive to the Row Address Counter 118 applying the COPY DONE signal to the Self Refresh Control circuit 116. The Refresh Control circuit 116 then causes the operation of the DRAM device 40 to exit at 170 to a process that maintains the DRAM device 40 in the low power, half density mode, as shown in FIG. 8. Other methods of generating the COPY DONE signal may be used eliminating the need for Row Address Counter 118. The starting address from Row Address Counter 58 could be stored when the copy begins and compared to the new address at each new refresh cycle. When the new address is the same as the stored beginning address then COPY DONE could be asserted. Yet another usable method is to monitor the most significant bit of Row Address Counter 118, in this case bit 0, and after three transitions low to high or high to low, generate the COPY DONE signal. This method may perform a few extra copy cycles but requires very little circuitry.

With reference to FIG. 8, the continued operation in the low power, half density mode is entered at 180. A time constant T in an internal timer is then set to $t_1$ at 182, and the status of the internal timer is checked at 184. The internal timer will not initially be timed-out. The operation will remain in a loop at 184, until the timer has timed out. The initial time constant $t_1$ is set to a relatively large value so that the internal timer will time-out after a delay corresponding to the permissible refresh rate of the DRAM device 40 in the low power, half density mode, as previously explained. When a determination is made at 184 that the timer has timed out, the memory cells in the array 44 are refreshed in the low power, half density mode.

Rows N (assumed in the present example to be initially row 0) and N+1 (assumed in the present example to be initially row 1) are then activated at 192 by causing the Array Control circuit 112 to generate an Activate Row signal while the Row Address Counter 58 is outputting the Row address for row N. However, in this mode, the least significant bit of the row address is ignored by the Row Address Counter 58 (FIG. 4) so both row N and row N+1 are activated. The sense amplifiers 96 (FIGS. 5 and 6) are then activated at 194 to drive the digit lines 80, 86 for each column to opposite voltages (0 volts and $V_{CC}$) corresponding to the data bits stored in the memory cell in that column of rows N and N+1. These voltages on the digit lines 80, 86 then return the memory cell capacitors in rows N and N+1 to their original charge level. Both rows N and N+1 are then deactivated at 196 and the sense amplifiers 96 are deenergized at 198.

Figure 9:
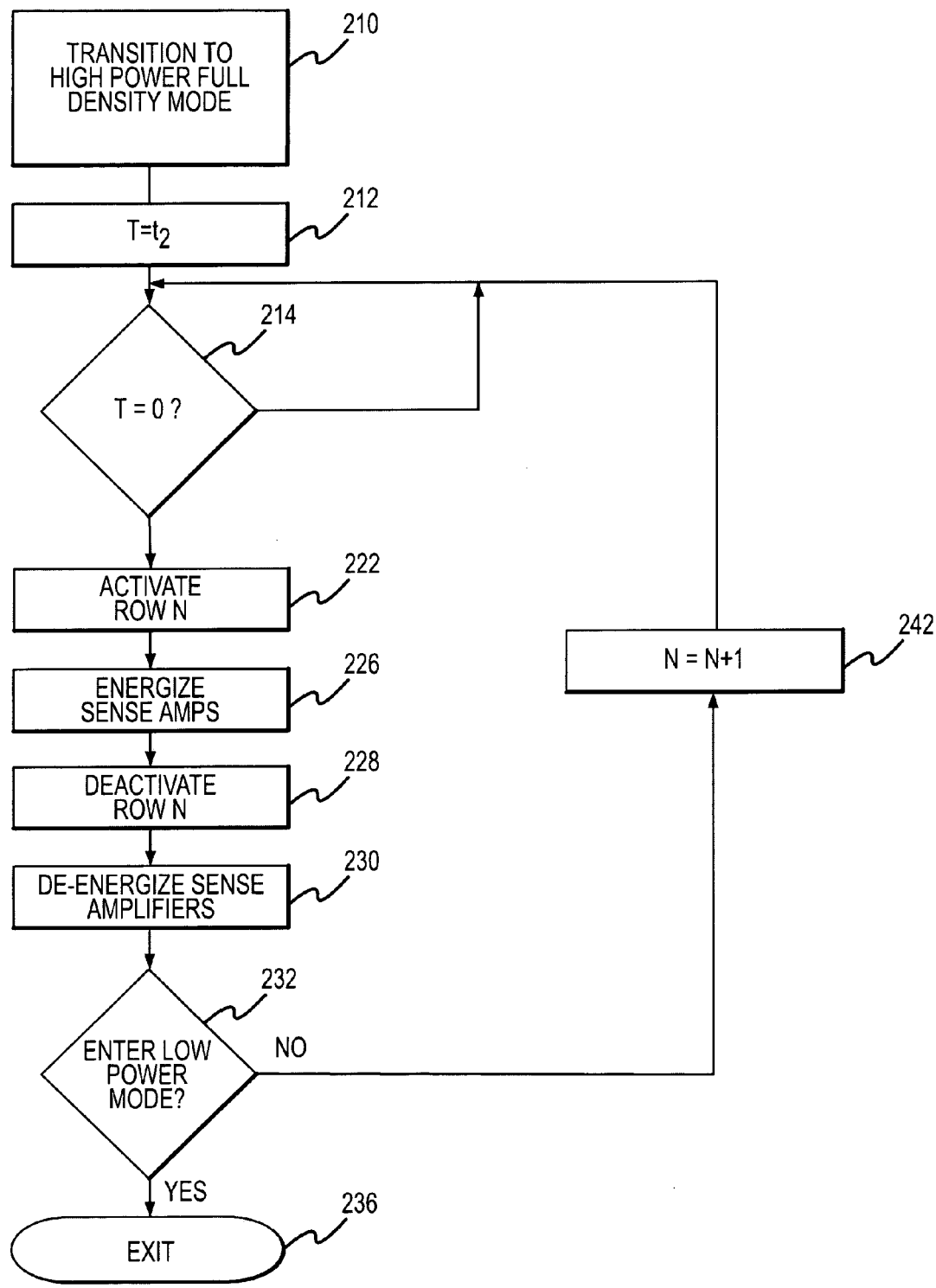
FIG. 9 is a flowchart showing the operation of the DRAM device of FIG. 4 when transitioning from the low power, half density mode to the high power, full density mode, and the continued operation in the high power, full density mode.

A determination is then made at 200 as to whether the DRAM device 40 is becoming active so that it should no longer operate in the low power, half density mode. If a determination is made at 200 that the DRAM device 40 should transition to the high power, full density mode, the half density procedure will exit at 202. The operation of the DRAM device 40 will than transition to the high power, full density mode as shown in FIG. 9. However, assuming that a determination is made at 200 that the DRAM device 40 is to continue operating in the low power mode, the Row Address Counter 60 is incremented by two rows at 206. The process then returns to 184 to await the timing-out of the internal timer for the next refresh cycle, at which time steps 192–198 are repeated.

Figure 7:
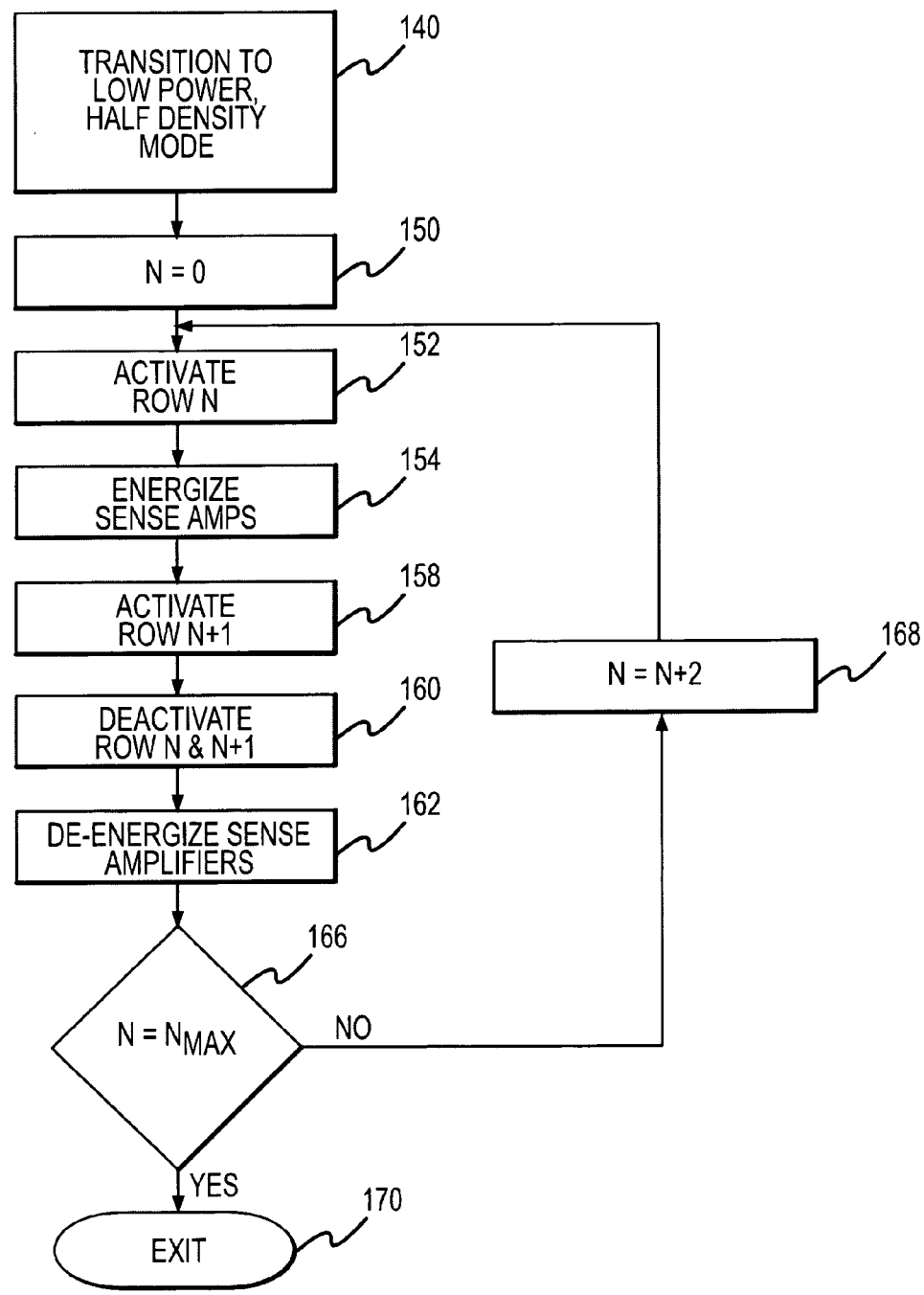
FIG. 7 is a flowchart showing the operation of the DRAM device of FIG. 4 when transitioning from the high power, full density mode to the low power, half density mode.

The principle difference between the transition to the low power, half density mode shown in FIG. 7 and continuous operation in the low power, half density mode shown in FIG. 8 is that, when continuing to operating in the low power mode, even and odd rows are activated at the same time rather than sequentially as in transitioning into the low power mode.

With reference to FIG. 9, the transition from the low power, half density mode to the high power, full density mode is initiated at 210. The transition may be initiated by applying appropriate mode bits to the high power, full density mode to the address bus 56 and generating the load mode register "LMR" signal to cause the mode bits to be loaded into the mode register 110. Alternatively, the electronic equipment containing the DRAM device may become active, thus requiring that the DRAM device be accessed. In transitioning to the high power, full density mode, the time T of internal timer is set at 212 to a value $t_2$ that is substantially shorter than the value $t_1$ to which the time T was initially set in the half density mode. The time value $t_2$ is commensurate with the significantly higher refresh rate required in the full density mode. The operation remains in a loop at 214, until the timer times out, as previously explained. The DRAM device 40 then undergoes a refresh cycle.

In contrast to the refresh procedures in the half density mode, in the full density mode, only a single row N is activated at 222. The sense amplifiers are then energized at 226. After the charge on the memory cell capacitor has been restored to its original value, the row N is deactivated at 228, and the sense amplifiers are deenergized at 230. A determination is made at 232 whether the DRAM device 40 has become inactive so that operation should transition to the low power, half density mode. If so, the procedure exits at 236 to the procedure shown in FIG. 7, as previously explained. Otherwise, the Row Address Counter 58 is incremented by one row at 242, and the procedure returns to 214 to wait until the next refresh is to begin. Alternatively, each refresh cycle can be initiated by an Auto Refresh command.

It will therefore be apparent that the DRAM device 40 can seamlessly transition back to-and-fourth between the high power, full density mode and the low power, half density mode without requiring cumbersome relocation of data in the odd rows.

Figure 10:
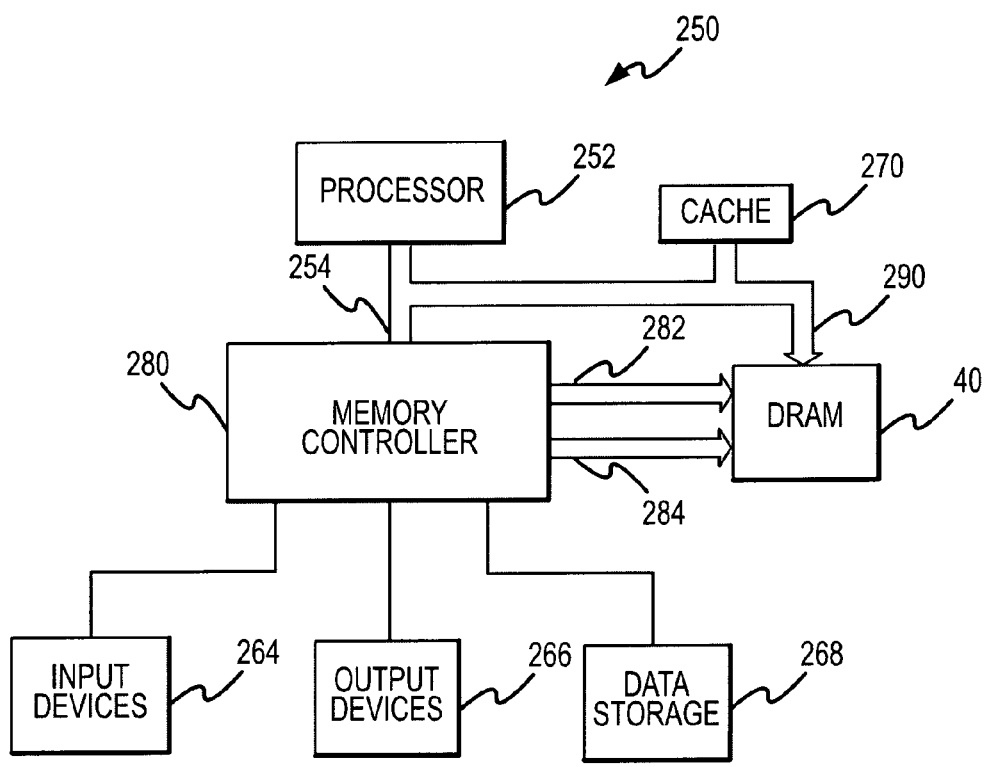
FIG. 10 is a block diagram of one embodiment of a computer system using the DRAM device of FIG. 4.

A computer system 250 using the DRAM device 40 of FIG. 4 is shown in FIG. 10. The computer system 250 includes a processor 252 for performing various computing functions, such as executing specific software to perform specific calculations or tasks. The processor 252 includes a processor bus 254 that normally includes an address bus, a control bus, and a data bus. In addition, the computer system 250 includes one or more input devices 264, such as a keyboard or a mouse, coupled to the processor 252 to allow an operator to interface with the computer system 250. Typically, the computer system 250 also includes one or more output devices 266 coupled to the processor 252, such output devices typically being a printer or a video terminal. One or more data storage devices 268 are also typically coupled to the processor 252 to allow the processor 252 to store data or retrieve data from internal or external storage media (not shown). Examples of typical storage devices 268 include hard and floppy disks, tape cassettes, and compact disk read-only memories (CD-ROMs). The processor 252 is also typically coupled to cache memory 270, which is usually static random access memory ("SRAM") and to the DRAM device 40, which may be a synchronous DRAM ("SDRAM") or another variety of DRAM, through a memory controller 280. The memory controller 280 normally includes a control bus 282 and an address bus 284 that is coupled to the DRAM device 40. A data bus 290 of the DRAM device 40 may be coupled to the processor bus 254 either directly (as shown), through the memory controller 280, or by some other means.

Although the present invention has been described with reference to a preferred embodiment, the invention is not limited to this preferred embodiment. For example, instead of storing data in two rows in the low power mode, data can alternatively be stored in 4, 8 or more rows by copying the data that is stored in the full density to mode to 3, 7 or more rows of memory cells, and reordering addresses accordingly. For example, for a quarter density mode, the two most significant row address bits can be reordered to be the two least significant row address bits inside the memory device. Then as the memory is written to sequentially, only every fourth row will be written internally if only one forth of the memory capacity is used. When transitioning to a quarter density mode, the valid row of data can be copied to the next three empty rows by first turning on the valid row, then turning on the empty rows as described previously. Thereafter, all four rows can be simultaneously turned on to enhance the signal applied to the senseamps and therefore improve the refresh characteristics. Conventionally memory cells are grouped into sub arrays of cells where each sub array has associated wordline drivers and senseamps where the row address MSB will select between groups of memory sub arrays. In the preferred embodiment of the present invention, the row address MSB is mapped to the internal row address LSB to allow for a fast row copy operation when transitioning to a low power partial density mode. Alternatively, the row address MSB could be remapped to some other row address within the sub array address space other than the low LSB. Therefore, the invention is limited only by the appended claims, which include within their scope all equivalent devices or methods which operate according to the principles of the invention as described.

The invention claimed is:

1. A method of operating a DRAM device in either a high power, full density mode or a low power, half density mode, comprising:
reordering each row address applied to the DRAM device by making the most significant bit of the row address the least significant bit of a reordered row address, and each of the remaining bits of the row address the next highest order bit of the reordered row address;
when operating in the full density mode, accessing rows of memory cells in an array according to the reordered row address;
when operating in the full density mode, refreshing the memory cells in the array at a first rate;
when operating in the half density mode, accessing rows of memory cells in the array according to the reordered row address, and, when accessing each row of memory cells, also accessing an adjacent row of memory cells;
when operating in the half density mode, refreshing memory cells in the memory array at a second rate that is slower than the first rate; and
when switching from operation in the full density mode to operation in the half density mode, transferring data from each row of the array in which data are stored to the adjacent row of memory cells.

2. The method of claim 1 wherein the act of transferring data from each row of the array to the adjacent row comprises:
activating a word line for the row thereby coupling each of the memory cells in the row to one of a respective pair of complimentary digit lines;
sensing the voltage between each of the complimentary pairs of digit lines using a respective sense amplifier that drives the differential voltage between the complimentary digit lines to a predetermined voltage; and
while each of the sense amplifiers is driving the predetermined voltage between the respective pair of complimentary digit lines, activating a word line for the adjacent row thereby coupling one of each of the pairs of complimentary digit lines to the respective memory cell in the adjacent row.

3. The method of claim 2 wherein the act of activating a word line comprises activating a word line for an even-numbered row, and wherein the act of activating a word line for a row adjacent the activated word line while each of the sense amplifiers is driving the predetermined voltage between the respective pair of complimentary digit lines comprises activating an odd-numbered word line for a row adjacent the even-numbered row having the activated word line.

4. The method of claim 1 wherein the DRAM device includes a pair of complimentary digit lines for each column of the array, and wherein, when operating in the half density mode, the act of accessing rows of memory cells in the array according to the reordered row address and accessing the adjacent row of memory cells comprises coupling a memory cell in each column of the accessed row of memory cells to the same digit line to which a memory cell in the same column of the adjacent row of memory cells is coupled.

5. The method of claim 1 wherein the DRAM device includes a pair of complimentary digit lines for each column of the array, and wherein, when operating in the half density mode, the act of accessing rows of memory cells in the array according to the reordered row address and accessing the adjacent row of memory cells comprises coupling a memory cell in each column of the accessed row of memory cells to a different digit line from which a memory cell in the same column of the adjacent row of memory cells is coupled.

6. A method of operating a DRAM device, comprising:
reordering each row address applied to the DRAM device by making the most significant bit of the row address the least significant bit of a reordered row address, and each of the remaining bits of the row address the next highest order bit of the reordered row address; and
accessing rows of memory cells in a memory array according to the reordered row address.

7. A method of operating a DRAM device in either a high power, full density mode or a low power, half density mode, comprising:

when operating in the full density mode, refreshing rows of memory cells in an array one-row-at-a-time at a first rate;

when operating in the half density mode, refreshing rows of memory cells in the array two-rows-at-a-time at a second rate that is slower than the first rate; and when switching from operation in the full density mode to operation in the half density mode, transferring data from each row of the array in which data are stored to another row of memory cells.

8. The method of claim 7 wherein the act of transferring data from each row of the array in which data are stored to another row of memory cells comprises transferring data from each row of the array in which data are stored to a respective adjacent row of memory cells.

9. The method of claim 7 wherein the act of transferring data from each row of the array in which data are stored to another row of memory cells comprises:

activating a word line for the row in which data are stored thereby coupling each of the memory cells in the row to one of a pair of respective complimentary digit lines;

sensing the voltage between each of the pairs of complimentary digit lines using a respective sense amplifier that drives the differential voltage between the complimentary digit lines to a predetermined voltage; and while each of the sense amplifiers is driving the predetermined voltage between the respective pair of complimentary digit lines, activating a word line for the another row of memory cells thereby coupling one of the digit lines in each of the pairs of complimentary digit lines to the respective memory cell in the another row of memory cells.

10. The method of claim 9 wherein the act of activating a word line for the another row of memory cells thereby coupling one of the digit lines in each of the pairs of complimentary digit lines to the respective memory cell in the another row of memory cells comprises activating a word line for a respective adjacent row of memory cells thereby coupling one of the digit lines in each of the pairs of complimentary digit lines to the respective memory cell in the respective adjacent row of memory cells.

11. The method of claim 7 wherein the act of refreshing rows of memory cells in the array two-rows-at-a-time comprises simultaneously refreshing adjacent rows of memory cells.

12. The method of claim 7 wherein the DRAM device includes a pair of complimentary digit lines for each column of the array, and wherein, when operating in the half density mode, the act of refreshing rows of memory cells in the array two-rows-at-a-time comprises simultaneously coupling a memory cell in each column of one row of memory cells to the same digit line to which a memory cell in the same column of another row of memory cells is coupled.

13. The method of claim 7 wherein the DRAM device includes a pair of complimentary digit lines for each column of the array, and wherein, when operating in the half density mode, the act of refreshing rows of memory cells in the array two-rows-at-a-time comprises simultaneously coupling a memory cell in each column of one row of memory cells to a different digit line from which a memory cell in the same column of another row of memory cells is coupled.

* * * * *